United States Patent [19]
Even et al.

[11] Patent Number: 5,312,691
[45] Date of Patent: May 17, 1994

[54] COPPER-CLAD MC4 UNSATURATED POLYESTER RESIN

[75] Inventors: Thomas E. Even, Memphis; Stephen K. Bishop, Ardmore, both of Tenn.; Lewis M. Perkey, Chesterland, Ohio

[73] Assignee: Glasteel Industrial Laminates, Inc., Collierville, Tenn.

[21] Appl. No.: 756,204

[22] Filed: Sep. 10, 1991

[51] Int. Cl.$^5$ .................... B32B 15/08; B32B 27/36; C08G 63/48; C08G 63/91

[52] U.S. Cl. .................... 428/458; 428/251; 428/273; 525/42; 525/48; 525/49

[58] Field of Search .................. 428/458, 480; 525/48, 525/49, 42

[56] References Cited

U.S. PATENT DOCUMENTS

| | | | |
|---|---|---|---|
| 4,318,954 | 3/1982 | Jensen | 428/209 |
| 4,873,274 | 10/1989 | Cummings et al. | 523/500 |
| 4,943,474 | 7/1990 | Tsunemi et al. | 428/246 |
| 4,990,397 | 2/1991 | Tsunemi et al. | 428/246 |
| 5,004,639 | 4/1991 | Desai | 428/192 |
| 5,009,949 | 4/1991 | Tanaka et al. | 428/251 |
| 5,077,326 | 12/1991 | Shibata et al. | 523/523 |
| 5,091,251 | 2/1992 | Sakumoto et al. | 428/344 |
| 5,126,192 | 6/1992 | Chellis et al. | 428/446 |
| 5,127,158 | 7/1992 | Nakano | 264/330 |
| 5,144,742 | 9/1992 | Lucas et al. | 156/291 |

*Primary Examiner*—George F. Lesmes
*Assistant Examiner*—Kathryne Elaine Shelborne
*Attorney, Agent, or Firm*—Spencer Frank & Schneider

[57] ABSTRACT

Metal foil laminates of an unsaturated polyester resin, MC4, characterized by high performance electrical, physical and mechanical properties and useful for electronic circuit boards, low impedence microwave boards and E.M.I.-R.F.I. shielding, and a process for preparing such a metal-clad laminate.

15 Claims, No Drawings

COPPER-CLAD MC4 UNSATURATED POLYESTER RESIN

RELATED APPLICATIONS

This application is related to concurrently filed application Ser. Nos. 07/756,203 and 07/756,202, both of which are incorporated herein by reference.

BACKGROUND OF THE INVENTION

Field of the Invention

The invention relates to a laminate of metal sheets bonded to an unsaturated polyester for use in electronic circuit boards, low impedance boards for microwave applications, and E.M.I.-R.F.I. shielding materials and a process for preparing such a laminate.

TECHNOLOGY REVIEW

Electrical circuit boards and E.M.I.-R.F.I. shielding are prepared by laminating sheets of electrical conducting material onto a base or support of electrical insulation material. A typically used conducting material is copper. The reliability of performance for the finished circuit board depends to a great degree on the physical, mechanical and electrical characteristics of the support material itself. Ideally, the support material would possess a high Tg, a low dielectric constant, a high comparative tracking index, a low coefficient of thermal expansion and could be processed with conventional manufacturing procedures. The insulation material may be rigid or flexible. Additionally, metal-clad laminates may be single-sided, with the conducting material on only one side of the insulation material, or double-sided, with the conducting material on both sides of the insulation material.

In the manufacturing electronic circuit boards, a conductive metal foil, usually but not always copper, is bonded to the electrical insulation support by means of an adhesive. For example, U.S. Pat. No.3,700,538 discloses adhesive bonding copper foil to resin-impregnated fiberglass cloth using polyimide resin adhesive. Alternatively, one may add an adhesion promoter to the resin material. For example, U.S. Pat. No. 4,093,768 discloses that unsaturated polyester resin containing up to about 2% by weight of benzotriazole can be bonded under pressure directly on a copper foil. Alternatively, treatment of the surface of the metal foil has been suggested to promote adhesion. For example, U.S. Pat. No. 3,729,294 describes a method of promoting adhesion of a polymer insulation coating to a copper surface by forming a thin film of zinc on the surface and heating the surface to diffuse the zinc therein. In the absence of such adhesives, adhesion promoters or metal treatments, the conductive metal foils do not generally bond sufficiently well to unsaturated polyester resins to make these resin useful as electrical insulation supports.

The bonding of the metal foil to the electrical insulation support material may be done by a either a non-continuous or a continuous process. An example of a non-continuous bonding process is the non-automated press bonding of the metal foil to B-stage resin. Such a manufacturing process may be preferable in certain small-scale applications, or for construction of a small number of laminates employing a very expensive electrical conductor such as gold. In general, the continuous process for the production of metal-clad laminates is preferred for large-scale manufacturing. As an example of such continuous bonding, U.S. Pat. No. 4,420,509 discloses a continuous process for bonding a metal foil to a polyester/epoxy/glass laminate resin system. Similarly, U.S. Pat. No. 4,587,161 discloses a continuous process for bonding a zinc-coated copper foil to the same type of polyester/epoxy/glass fiber resinous base. Due to the high output rates and high degree of automation, such continuous processes of manufacturing metal-clad laminates can substantially reduce the cost of production as compared to a non-continuous process.

In general, electrical insulation materials many times contain a structural reinforcement, such as glass fibers, to improve the material strength of the product. Depending on the particular resin and intended use of the board, these reinforcements may be either woven or non-woven, and may be dispersed throughout the resin in either a randomly oriented or non-randomly oriented fashion. For example, an electrical-grade glass mat sheet is representative of a woven, non-random support whereas randomly distributed, chopped glass fiber is an example of a non-woven, randomly oriented support. Standards for polyester glass-mat sheets, for example Grades GPO-1, GPO-2, and GPO-3, are established by the National Electrical Manufacturer's Association. As an alternative to glass mats, glass fibers may be randomly dispersed throughout the resin. Both organic and inorganic materials are suitable as a structural reinforcement. Additionally, other fillers may be incorporated in the support material.

Electrical insulation materials, especially those in circuit boards, also frequently contain flame retardants. These flame-retardants can be incorporated in the form of a monomeric unit during the curing of the resin. Alternatively, flame-retardant monomers may be incorporated in the production of the base resin. Examples of monomeric flame retardant materials are brominated, chlorinated or other halogenated vinyl monomers. For example, Dibromostyrene (DBS), available from Great Lakes Chemicals, Eldorado, Ark., is a suitable brominated vinyl monomer. The flame retardant materials may also either be organic, as in the case of the above-mentioned monomers, or may be inorganic. Aluminum trihydrate is representitive of an inorganic flame retardant suitable for use in electrical circuit board supports.

Of the physical characteristics upon which circuit board reliability depends, one of the most critical is the magnitude of z-axis expansion during thermal cycling. The electrical insulation materials which possess a high coefficient of thermal expansion expand to a much greater degree than the metal hole barrels, resulting in the deformation of the barrels and subsequently a substantial number of failures in the circuit boards. This failure due to high z-axis expansion is magnified in double-sided boards due to the high concentration of resin in these boards. Generally, the number of failures can be expected to increase with increasing number of thermal shock cycles, but the number of failures may be reduced somewhat by a prebake of the material.

An additional problem associated with certain electrical insulation materials is that the z-axis expansion increases at a much higher rate at temperatures above the Tg than at temperatures below the Tg. Such a characteristic of the electrical insulation material may exacerbate the aforementioned problem of metal plated through hole failures. As a result, electrical insulation materials that have both a relatively high Tg and a relatively low rate of change in z-axis expansion above the Tg would be preferred. Thus, although it is difficult to greatly change the expansion properties of a material, much effort has been placed in achieving even modest improvements in this property.

There are two general types of electrical insulation support materials for high performance uses currently employed in the electronic circuit board industry: those based on epoxy resins and those based on much more expensive materials. The epoxy electrical insulation resins, exemplified by FR4 resin, have the particular advantages of both ease of processing and low cost of manufacture. For example, the manufacture of laminates comprising epoxy resins can be highly mechanized. Along with the low cost of base materials, this mechanization results in superior production costs as compared to other generally used electrical insulation support materials. The highly favorable cost and processing advantages of the epoxy resins are substantially offset, however, by the physical and electrical properties of these materials. For example, FR4 resin possesses a relatively low Tg of about 120°0C., as well as a relatively low maximum working temperature of about 120° to 130° C. Furthermore, FR4 epoxy resin has a z-axis expansion of 55 to 80 ppm/°C. below Tg and of 250 to 400 ppm/°C. above Tg. This expansion corresponds to about 2.2% to 3.0% between 40° C. and 180° C., and about 4.4% between 20° C. and 260° C. Such expansion properties do not compare well with that of the copper foil, which expands at about 18 ppm/°C. The poor electrical properties of FR4 and similar resins include a relatively high dielectric constant of about 4.8, a relatively high dissipation factor of about 0.020, a relatively low minimum surface resistance of $5 \times 10^3$ megohms and a relatively low volume resistivity of $1 \times 10^5$ megohm-cm. As is known to one skilled in the art of electrical insulation materials, the aforementioned relatively poor physical and electrical properties of epoxy resins render this material unsuitable for use as an electrical insulation support in demanding applications, particularly those applications involving high temperature manipulations or operations.

The second general class of electrical insulation materials, the "high performance" insulation materials, overall have physical and electrical properties superior to those of epoxy resin systems. The high performance resins generally possess a relatively low z-axis expansion, a relatively high Tg, a relatively low dielectric constant, and relatively high surface and volume resistivities. Examples of high performance electrical insulation materials are those made of polyimide, cyanate ester and PTFE ™ (Dupont). By "high performance electrical insulation material" it is meant that the electrical insulation material has a plurality of physical and electrical characteristics which render the resin superior to that of a traditional epoxy resin in electrical and related applications. For example, polyimide resins can withstand repeated exposure to temperatures up to 260° C., the temperature of a liquid solder bath, with generally a lower number of failures in metal plated through holes due to temperature stress. This is because, for example, polyimide possesses a relatively high Tg of 205° C., and a z-axis expansion below Tg of 49 ppm/°C., and that above the Tg of 195 ppm/°C. This expansion corresponds to about 0.7% between 40° C. and 180° C. The electrical properties of the high performance electrical insulation materials are also generally superior to those comprising epoxy resins, although expensive enhancement to the epoxy can bridge this gap. As an example of the superior electrical properties of high performance materials, polyimide has a relatively low dissipation factor at 1 MHz of 0.011.

The primary drawbacks associated with the high performance electrical insulation materials is that the cost of laminates comprising these materials is prohibitively high for general use in the electronics industry. For example, in addition to the relatively high cost of base materials, the high performance electrical insulation materials are very difficult to process, resulting in low yields of the final product. Additionally, the dimensional stability of the high performance materials is much less than that of even FR4 during processing, since the shrinkage is not radial as in the epoxy resins, but rather unidirectional. The high performance electrical insulation materials are also inert to most available conditioning processes for the through hole wall, which contributes substantially to the number of plated metal through-hole failures.

Resins consisting of unsaturated polyester alone have not been generally useful as an electrical insulation material for several reasons including excessive brittleness and unacceptable levels of z-axis expansion. In the absence of a large amount of monomer, a completely unsaturated polyester resin is highly reactive, resulting in a very brittle resin. This brittleness makes processing these resins very difficult, particularly when thinness is desired as, for example, in use as an electrical circuit board support. Additionally, any cracks that develop in products made with these resins subsequently propagate throughout the product. In the presence of the amount of monomer needed to overcome the brittleness of unsaturated polyester resin, the resin then becomes too flexible and expandable, with the result that the z-axis expansion becomes unacceptable for applications or processes in which the temperatures encountered vary greatly or are extremely high. For example, similar to the epoxy resins, under the high temperature conditions encountered in the processing of electrical circuit boards, an unsaturated polyester support leads to failure in a substantial number of the metal plated through holes. A further potential drawback to the use of unsaturated polyester resins is that the conducting metal foil of an electrical circuit board does not generally bind strongly to the resin. Use of adhesion promoters will, however, substantially overcome this bond strength problem. For example, U.S. Pat. No. 4,093,768 discloses that when the adhesion promoter benzotriazole is incorporated into an unsaturated polyester resin at up to about 2% by weight, then a copper foil can be directly pressure bonded to the resin. However, due to limitations such as those described above, it was not possible to make reliable materials for general use and with acceptable electrical insulation properties from unsaturated polyester resins. The same disadvantages associated with the polyester resins and epoxy resins, also hold true for mixed polyester/epoxy resins.

As a result of the various advantages and disadvantages associated with the known electrical insulation materials, one in the art must determine which type of material to employ based upon the specific final application of the metal laminate of these materials. Particularly when cost is a predominant factor in this determination, one is constrained to the use of the lower performance materials of the epoxy or similar type. In other cases, one is confined to use the high performance materials, regardless of the cost, to satisfy the requirements of the particular processing or final application.

There thus exists a great need for metal-clad laminates which have both the excellent electrical properties of the laminates based on high performance insulation supports as well as the low cost and ease of processing of metal-clad laminates of epoxy and similar resins.

SUMMARY OF THE INVENTION

The invention provides a laminate of a metal foil bonded to an unsaturated polyester electrical insulation support material, MC4, which is useful the production of electronic circuit boards, E.M.I.-R.F.I shielding material and low impedance boards for microwave applications. The product of the invention is both economical and easily processed within existing industry methods. To prepare the electrical insulation support, a fully unsaturated polyester is first chemically modified to generate a partially unsaturated polyester. A blend comprising this partially unsaturated polyester, a completely unsaturated polyester and a vinyl monomer is then prepared. The blend of the present invention may also contain fillers and/or a structural reinforcement, which may be woven or non-woven, randomly or non-randomly oriented with respect to the resin, and comprising either organic or inorganic material. A flame-retardant material may also be incorporated into the resin blend of the present invention. Adhesion promoters, which aide in the bonding of metal to the polyester resin, are also generally included in the blend. The polyester blend is cured through a multi-tiered catalyst system. The metal foil laminate of the present invention may be either single-sided or double-sided.

The process of the invention provides a metal-clad, single-sided or double-sided laminate of an unsaturated polyester resin useful in the electrical and microwave industries. The process of the present invention may, but need not, be a continuous process of preparing these metal-clad laminates.

DETAILED DESCRIPTION OF THE INVENTION

It is one object of present invention to develop a metal-clad laminate system for use as electronic circuit boards, low impedance microwave boards, E.M.I.-R.F.I shielding and other applications, which would combine the low cost and ease of processing of the epoxy type systems with the superior electrical properties of the high performance systems. The discovery of the present invention relates to the unexpected finding that an unsaturated polyester resin blend can be made to possess high performance properties previously reserved for materials that are both much more costly and much more difficult to process than polyesters, and that metal-clad laminates of this polyester are thereby superior to other laminates currently available. Two of the great advantages of such a polyester-based, high performance metal-foil laminate are that the processing is readily performed in systems designed for existing epoxy-based manufacturing and the cost is comparable to that of these relatively inexpensive systems.

Electrical circuit boards employ a copper, or other metal, foil which is bonded to an insulation support. The metal foil is subsequently etched away to leave behind portions of the copper foil as an electrical conductor. Electrodeposited foil is generally used in the manufacture of electrical circuit board and E.M.I.-R.F.I. shielding materials. Electrodeposited foil is produces by plating from a stainless steel drum, from which the copper foil is continuously stripped. The copper foil thickness is customarily measured in terms of the number of ounces of copper per square foot of the foil. In most cases, electrical circuit boards and shielding employ copper foil of one or two ounces per square foot thickness. Foils of one ounce per square foot have a thickness of about 0.0036 cm whereas two ounce foils have a thickness of approximately 0.0071 cm. As an alternative to the electrodepositing of the metal foil, an electroless system, such as the Koll-Morgan CC4 ™ additive process, may also be used.

The metal foil of the laminate of the present invention may be heated prior to application to the polyester film. Preheating helps to avoid the surface imperfections that interfere with the adhesion of the metal to the polyester surface. Thus, preheating may increase the bond strength between the metal and the polyester, and thereby improve the overall quality of the subsequent laminate.

According to one preferred process of the present invention, a copper, or other metal, foil is coated with the unsaturated polyester resin blend of the invention. The coating is uniformly applied to the metal foil using a doctor blade set to form a puddle of excess polyester resin. When desired, either a mat of glass fiber or, alternatively, randomly distributed glass fiber is then uniformly distributed across the polyester blend which is carried by the metal foil. The foil carrying the polyester is then placed on a first laminating table where a uniform temperature is maintained across the metal sheet and the accompanying resin. The heat of the first laminating table is preferably set at between 95° C. and 125° C. The heat so applied initiates the lowest tier of catalysis in the multi-tier system of catalysis of the present invention. The copper sheet carrying the polyester is preferably kept at this first temperature for 2 to 4 minutes, after which the copper and associated polyester are transported to an oven which heats the metal and resin to a temperature of between 130° C. and 170° C., at which the second tier and third tier catalysts become active. In the preferred process of the present invention the copper and polyester resin are maintained at this second temperature for between 4 and 11 minutes, until the resin is fully cured.

In a preferred continuous process of the present invention, a second metal foil may be applied to B-stage polyester resin after leaving the first table, and prior to entering the oven. In this process of the invention, the double-sided laminate enters squeeze rollers, which are set to the appropriate thickness of the final laminate, prior to entering the oven. In such a process, the amount of polyester left on the first metal foil by the doctor blade must be enough such that there is excess resin removed from the copper-polyester-copper sandwich as it enters the squeeze rollers. Such an excess polyester assures there is sufficient resin for the formation of a continuous bond between the resin and both sheets of metal foil. The puddle of polyester resin that forms at the squeeze rolls coats the second metal foil prior to the point of application of the foil to the gelling laminate. The second foil is thus raised to the temperature of the gelling polyester, before the foil is applied to the laminate. This preheating of the second metal foil eliminates air bubbles and other imperfections that would interfere with the adhesion of the foil to the resin. Additionally, the air bubbles are not wanted in the product of the present invention as their presence will alter the electrical properties across that particular region of the insulation material. If it is desired to produce a single-sided laminate, then the second metal foil is not incorporated into the process. In a preferred continuous process of the present invention, the squeeze rolls are set such that the final thickness of the laminate is from about 0.0075 cm and 0.1 cm, depending upon the final application of the metal-clad laminate. Thus, for most applications, the setting of the squeeze rolls is set preferably between 0.0075 cm and 0.1 cm. After curing of the resin in the laminate of the present invention, the laminate edge is trimmed, by shearing, to the desired width.

The completely unsaturated polyester resin used herein may generally be described as a linear polyester resin capable of cross-linking with vinyl monomers and thereby to other polyester chains, to form copolymers. The partially unsaturated polyester resin is generally the result of chemical modification of a completely unsaturated polyester resin, as described above, such that much of the unsaturation is removed. The base completely unsaturated and partially unsaturated polyesters of the present invention are combinations of glycols and dibasic acids. In the process and product of the instant invention, suitable glycols are propylene glycol, ethylene glycol, dipropylene glycol, diethylene glycol and the like. Suitable dibasic acids are pthalic anhydride, isopthalic anhydride, maleic anhydride, maleic acid, adipic acid, fumeric acid and the like.

In order to overcome the brittleness problem inherent in the completely unsaturated polyester resin systems, a great deal of the unsaturation is first removed from the base polyester chain by chemical modification. For example, such a chemical modification as the reaction of the fully unsaturated polyester chain with dicyclopentadiene is preferred in the process of the present invention. This chemically-modified polyester may, but need not, be additionally reacted with vinyl monomers such a styrene to lower the viscosity of the resin and facilitate subsequent processing. In the most preferred embodiment of the present invention, the base polyester which has been chemically modified as above, is polyester resin 67, which is available from The Alpha Corp., Collierville, Tenn. The degree of unsaturation of the partially unsaturated polyester of the instant invention is approximately 55% that of a completely unsaturated polyester. However, as discussed below, other degrees of unsaturation ranging from about 20% to about 70%, by weight as compared to the total weight of resin, are also contemplated in the process and product of the present invention. Additionally, although the chemical modification using dicyclopentadiene is preferred in the process and product of the instant invention, it should be appreciated that any chemical -modification which substantially reduces the unsaturation in a polyester chain is suitable to produce the partially unsaturated polyester resin of the present invention.

The chemical modification of the completely unsaturated polyester creates a partially unsaturated polyester system designated "System Ill, which is less reactive than a completely unsaturated polyester resin as a result of the modification. The System I polyester is then blended together with a completely unsaturated polyester, the latter of which is designated "System II". By "completely unsaturated polyester" it is meant a standard polyester that has not been chemically modified to remove the unsaturation present in the chain. By a polyester resin "System" it is meant a polyester resin which is a component of a mixture comprising a plurality of polyester resins, wherein the polyester resins in the mixture are distinct from one another with respect to chemical composition and/or degree of unsaturation of the polyester chains. Standard production resins may be used for either or both the System I or System II polyesters and the completely unsaturated precursor of the System I polyester may, but need not, be based on the same monomeric units as the System II polyester. The invention thus contemplates both homo- and heteropolymeric unsaturated polyester resin blends. In the preferred process and product of the instant invention, the completely unsaturated, System II polyester is resin 78, also available from The Alpha Corp., Collierville, Tenn. Since the System I polyester is relatively less reactive than the System II polyester, when the two Systems are blended together in the appropriate ratio in producing the semi-unsaturated polyester resin blend, much of the highly unfavorable brittleness of a completely unsaturated polyester is eliminated.

A blend of more than two polyester Systems is also contemplated by the present invention. For example, in certain applications of the instant invention, one may prefer a three System resin in which System III is a second, chemically distinct, completely unsaturated polyester resin, incorporated in the blend in partial replacement of the completely unsaturated System II polyester. A resin blend of the present invention comprising such additional System resins may further enhance the beneficial electrical, physical or mechanical properties of the product of the instant invention. Other resins heretofore used as electrical insulation supports, such as epoxy, cyanate ester and polyimide, may be incorporated in the resin blend of the present invention, but the preferred resin blend is made of polyester resins alone as described herein.

The present invention additionally contemplates a process and product wherein both the System I and System II resins are partially unsaturated, although not necessarily to the same extent. As would be appreciated by one skilled in the art of resins, the important characteristics of the unsaturated polyester resin blend of the instant invention are that the totality of the individual Systems, when blended together, result in a composition that is sufficiently unsaturated to permit extensive inter-chain bonding, and so relatively low expansion properties, while at the same time being sufficiently saturated to prevent the high reactivity and therefore brittleness of the material.

In the product and process of the present invention using the preferred base polyester resins, it has been found that about a 20% by weight minimum of partially unsaturated System I polyester, as compared to the total weight of resin, is required to obtain the product of the present invention with the desired physical, electrical and mechanical properties. Acceptable blends between base polyesters in the instant invention are from about 20% to about 70%, by weight, partially unsaturated polyester (System I) and from about 80% to about 30%, by weight, completely unsaturated polyester (System II), as compared to the total weight of resin. A preferred composition is from about 40% to about 60%, by weight, System I polyester and from about 60% to about 40%, by weight, System II polyester, both as compared to the total weight of resin. In the most preferred process and product of the present invention, System I polyester comprises from about 45% to about 55%, by weight, and System II polyester comprises from about 55% to about 45%, by weight, both as compared to the total weight of resin.

A vinyl monomer is also included in the blend of the System I and System II resins. The blend of a System I polyester resin with a System II polyester resin, both as a generally-defined polyester resin "System", and a vinyl monomer is referred to as a "semi-unsaturated" polyester resin blend. In one preferred embodiment of the invention, the vinyl monomer is chosen to be one which is highly reactive, such that all the monomer can subsequently be reacted and the processing of the material facilitated. In the preferred product and process of the present invention, the vinyl monomer comprises divinyl benzene and equivalent derivatives thereof. The highly reactive monomer incorporated in the blend with the System I and System II resins in the present invention also preferably possesses flame-retardant characteristics. Typical flame retardants are brominated, chlorinated or other halogenated vinyl monomers. The inclusion of the flame-retardant feature in the vinyl monomer is generally preferred the instant process as it allows one to practice the invention using System I and System II polyester chains which do not have these more expensive monomers incorporated therein. The cost of producing the unsaturated polyester of the present invention is thereby reduced when the final application does not require the flame-retardant feature by using vinyl monomers lacking this feature. As an alternative to the use of flame-retardant vinyl monomers, other flame-retardant materials, either organic or inorganic, may be incorporated into the polyester resin blend of the instant invention.

In the process and product of the present invention, flame retardants such as brominated vinyl monomers are incorporated in amounts ranging from about 5% to about 40%, by weight bromine, as compared to the weight of the semi-unsaturated resin blend. Inorganic flame retardants, such as Aluminum trihydrate, may also be incorporated in the blend of the present invention. In a preferred embodiment, the flame-retardant vinyl monomers are incorporated in the range of from about 13% to about 33%, by weight bromine, as compared to the weight of the semi-unsaturated resin blend. In the most preferred process and product of the instant invention, the flame-retardant vinyl monomer is incorporated in from about 17% to about 28%, by weight bromine, as compared to the weight of the semi-unsaturated resin blend.

Structural reinforcements may also be included in the blend of the present invention. Glass is particularly useful as a structural reinforcement because of its high tensile strength, high modulus of elasticity, ability to be formed in small diameter fibers, inertness, and low specific gravity compared to equally strong fibers. Chopped glass fiber strands may be randomly oriented in the resin layer, or these fibers may be placed in the resin in a non-random way, such as in parallel arrays. In one preferred process of the present invention, glass fibers are chopped into filaments about 3 cm. long, and randomly distributed into the polyester resin layer. The resulting structural reinforcement is thus randomly oriented with respect to the resin. In general, when a structural reinforcement of unwoven glass fibers is deemed appropriate in the product and process of the present invention, the weight of the glass fiber filaments distributed into the polyester resin is from about 10% to about 30%, by weight, as compared to weight of the resin, preferably by about 10% to about 20%, by weight, as compared to the weight of the resin, and most preferably from about 12% to about 15%, by weight, as compared to the weight of the resin. In another preferred embodiment of the present invention, a mat of electrical grade glass fibers weighing from about 0.025 ounces to about 12 ounces per square foot is uniformly applied to the polyester resin layer. This second preferred embodiment exemplifies a woven, non-random structural reinforcement. The woven glass in the present invention may also be either continuous or non-continuous, and is preferred in the product and process of the present invention to comprise less than about 60% glass, by weight, as compared to the weight of the resin blend. Additionally, the structural reinforcement may be either organic or inorganic. The glass fibers and glass mats are examples of inorganic reinforcements. Additional inorganic structural reinforcements suitable for use in the present invention are quartz fibers and Kevlar TM fibers. Examples of suitable organic structural reinforcements under the product and process of the instant invention are carbon fiber, cellulose fiber, polyester fiber and cloth.

Fillers may also be added to the blend of System I and System II polyesters and the vinyl monomer. Typical fillers include Georgia kaolin, fused silica, aluminum trihydrate, nepheline, CA-5 calcium sulfate, and glass microspheres. The fillers of the present invention may also be either organic or inorganic materials containing catalysts for the additive plating of copper, or other electrical conductor, onto the substrate. An example of such a filler is CAT 10, which uses palladium on Koalin clay for making electroless copper deposits as, for example, in the Koll-Morgan CC4 TM additive process. The use of fillers may improve both the electrical and mechanical properties of the final resin while at the same time substantially reducing the cost of materials. In the process of the present invention the filler comprises from about 0 parts to about 50 parts, by weight, per 100 parts by weight semi-unsaturatede resin blend. Preferably, the filler comprises from about 0 to about 30 parts by weight, per 100 parts by weight of the semi-unsaturated resin blend. Most preferably the filler comprises from about 0 to about 20 parts by weight, per 100 parts by weight of the semi-unsaturated resin blend.

Adhesion promoters are also generally added to the polyester resin blend to increase the bonding strength of the conductive metal foil to the unsaturated polyester resin. Examples of suitable adhesion promoters are methyl acrylic acid (MAA), or other acids, or sodium silicate. The addition of MAA to the resin blend of the present invention, at a concentration of about 5%, by weight as compared to the weight of the semi-unsaturated resin blend, has been found to remarkably improve the peel bond strength of a copper-clad laminate, and is thus preferred in the process and product of the present invention.

Besides the nature of the raw materials that go into the polyester resin, the system of catalysis has also been found to be critical for achieving the desired final properties of the metal-clad laminate. One factor central to the present invention is that different catalysts have different half-lives at a given temperature. Additionally, different catalysts have different optimum temperatures at which they initiate free radical reactions. Thus, as detailed below, curing processes over the course of which different temperatures are desired, can be controlled by the active catalyst present at any given step.

In order for the system to be useful for production of extremely thin boards, each with the same cure characteristics, a multi-tiered, free-radical based system of catalysis has been developed and forms an integral part of the present invention. By "multi-tier" and "multi-tiered" catalyst system, it is meant that in which a plurality of temperature levels and catalysts are used in the catalytic process of curing a resin, such that this process occurs in a step-wise fashion, with each step primarily catalyzing a different reaction between the components of the blend and different catalysts primarily catalyzing each of the different steps. The initiation of each step in the multi-tiered catalyst system of the present invention is controlled by the temperature of the reaction and the characteristics of the catalysts present in the blend. The step-wise nature of the multi-tiered catalyst system of the present invention is accomplished by choosing a system of catalysts which have overlapping reactivity temperatures but whose half lifes at the chosen temperatures differ greatly. One primary consideration in the choice of catalysts used in the multi-step catalytic system of the present invention is that the activity of the catalyst for any given temperature step is significantly enhanced at the temperature of the following catalytic steps (i.e., the catalyst has a very short half-life at the subsequent temperature). Additionally, all but the lowest end (first active) catalyst are chosen such that their activity is very low at the temperature of the low end (first) catalytic step (i.e., the catalysts have a very long half-life at the low end catalytic step). For example, in a three-tiered catalyst system, three catalysts are selected such that the half life of the first, low end, catalyst at a first temperature is in minutes, while the half life of the second, middle tier, and third, high end, catalysts are in hours at this first temperature. At the second, higher temperature, the half life of the low end catalyst is in seconds, while the half life of the second catalyst is in minutes and the half life of the third, high end, catalyst is substantially greater than that of the middle tier catalyst.

In a multi-tiered catalytic system in the present invention, the low end catalyst triggers and maintains the reaction of the vinyl monomer, most preferably a halogenated divinyl benzene derivative, to the polyester chain. This reaction is preferably carried out at a temperature of from about 95° C. to about 120° C., such that the reaction is at a temperature below the boiling point of the vinyl monomer. At temperatures higher than this preferred range, there is an inadequate number of monomer linkages to the polyesters in the blend, and during the subsequent exotherm, products comprising a substantial amount of poly(monomer) and a substantial amount of the polyester chains bonded together by poly(monomer), are formed. Such poly(monomer) containing products are undesirable for the intended use of the product of the present invention. Below the preferred temperature range for the low end catalytic step, the low end catalyst is not sufficiently active, such that the addition of monomers to the polyesters in the blend is too slow a process. By choosing middle tier and high end catalysts which are relatively stable (a half life of greater than one hour) in the temperature range from about 95° C. to about 120° C., auto acceleration of the reaction system from the low end tier to the exotherm is prevented. Alternatively, catalysts with half lifes of greater than 10 minutes at these higher temperatures could be employed in the product and process of the present invention, provided that such catalysts are very slow to react. It would be recognized, however, by one skilled in the art of curing resins, that the aforementioned limitation to the temperature ranges at this step can be overcome by increasing the pressure under which the low end cure reaction is taking place.

In a preferred process of the present invention, the metal foil is directly bonded, as detailed above, to the partially cured polyester resin blend obtained after the first tier of catalysis. During the period of time over which the resin is applied to the copper foil, the temperature of the foil resin is preferably maintained at between 95° C. and 125° C. This temperature range is preferred as any residual first tier catalyst will be essentially exhausted, while the second and third tier catalysts will not be activated.

To initiate the second stage of the curing reaction in the multi-tiered catalyst system of the instant invention, the temperature of the copper and associated polyester is raised, preferably to from about 130° C. to about 170° C. At this temperature, any remaining low end catalyst is quickly consumed, while the middle tier catalyst is in a preferred range for initiating further reactions, and thus helping to initiate the exotherm of the reaction. The middle tier catalyst also helps maintain the reactions between polyester chains. However, in the multi-tier catalyst system of the present invention the middle tier catalyst has a relatively short half-life in the temperature range of from about 130° C. to about 170° C., and thus will be consumed before the reaction has gone to completion. The high end catalyst, having a relatively long half-life at this higher temperature, provides the free radical generation to drive the cure reaction to completion, and thereby eliminating any unreacted monomer in the blend as well as any double bonds contained in the reacted polyester chains. The high temperature of the highest tier of the reaction is additionally preferred as this temperature increases molecular mobility of the chains as they crosslink in the final stages of the reaction, thereby resulting in very few chains that are not sufficiently crosslinked to other chains.

In the preferred product and process of the present invention, the low end catalyst in the multi-tier catalyst system is tert-butyl peroctoate, which has a half life of about 15 minutes at 105° C. and a half-life of about 20 seconds at 145° C. The preferred middle-tier catalyst of the present invention is tert-butyl perbenzoate, which has a half-life of about 10 hours at 105° C. (i.e., the catalyst is essentially inactive) and a half-life of about 8 minutes at about 145° C. The preferred high end catalyst of the instant invention is di-cumyl peroxide which has a half-life of greater than 40 hours at about 105° C. (essentially inactive) and a half-life of about 30 minutes at 145° C. Although these catalysts are preferred for the product and process of the instant invention, it would be readily apparent to one skilled in the art of resin curing that many other catalyst combinations could be employed for use in any tier of the multi-tier catalyst system so long as that catalyst possesses the appropriate activation temperature and half life, as exemplified above, for that tier.

In the multi-tier catalyst system of the instant invention, the time of reaction at each of the temperatures is another critical processing parameter. It is thus important that the speed of the laminating tables in a continuous lamination process be adjusted so as to result in the proper timing of the curing reactions. In the process of the present invention between from about 2 minutes to about 4 minutes is preferred for the reaction between the vinyl monomers and the polyester chains. At times shorter than this preferred time, not enough monomer has reacted with the resin, resulting in the same unwanted situation as when the temperature at this step is below the preferred range. At times greater than that preferred, the reaction of monomers with the polyester resin is essentially complete, and time is wasted in the process of the invention. The time at temperature for the middle and high tiers of the multi-tier system of catalysis must be kept long enough such that the resin is essentially completely cured. In the preferred process of the present invention, this time is from about 4 minutes to about 11 minutes. A time at temperature shorter than that preferred may result in a product that does not have the desired electrical and physical characteristics, as the amount of reactivity and inter-chain crosslinking will not be maximized. It should be recognized by one skilled in the art of curing resins, that for applications that do not require the most superior physical and electrical properties of the product of the present invention, and when cost is a major consideration, a time at temperature less than that preferred for the final curing step may be economically appropriate.

The process and product of the present invention are not meant to be limited to the preferred three-tiered or four-tiered catalytic system, as higher numbers of tiers can be used to generate the product of the invention. With the use of a higher number of catalysts, smaller temperature steps could be optimized and used. However, it is envisioned that much greater than four steps would result in the heat generated in the reaction increasing at a sufficiently high rate such that too much catalyst would be initiated, a subsequently react with itself to form undesirable low boiling point by-products.

An example of when a fourth tier of catalysis might be useful is when the temperature at exotherm is not maintained for a sufficiently long time without the inclusion of the fourth catalyst. In this case, the inclusion of a fourth, higher tier catalyst may assist in achieving the desired final properties of the product of the invention. If, however, the temperature at exotherm is maintained sufficiently long, the reaction will be complete and no post-cure would be required. Under these latter conditions a fourth, yet higher tier catalyst incorporated in the blend would not improve the product. In the process of the invention, sufficient amounts of the high end catalyst may remain present following the completion of the reaction and later removed by a post-cure step, but neither post-cure nor excess catalyst for a post-cure are generally required for the process and the product of the present invention, and the inclusion or exclusion of such steps is dependent upon the specific final use of the product as is known in the art of resins. When applicable, the resin can be prebaked at a temperature of about 350° C. for about 4 hours, if the final application so requires, as is known in the art of electrical insulation materials.

It should be understood that the present invention is not limited to the use of only copper foil. For example, aluminum foils, or zinc-coated aluminum foils can be used in the process of the present invention when a less costly final product is desired. On the other hand, foils comprising gold, silver, tantalum and titanium can be used for laminates requiring the electrical, physical and mechanical properties of these more expensive materials. It is further envisioned that other metals may be used in the product and process of the present invention as are known in the art of metal-clad laminates.

Due to the unique combination of materials and steps in the process of the present invention, the metal-clad laminate thereby produced is superior to all previously available low cost metal-clad laminates, to the point that this new laminate is highly competitive with the high performance metal-clad laminates. For example, the resin of the present invention has a z-axis expansion between 400C. and 180° C. of only about 1.2% to about 1.9%, depending upon the conditions employed. The glass transition temperature of the polyester resin of the instant invention is between about 140° C. and 180° C., and is much smoother than that of FR4 epoxy resin. For example, the z-axis expansion below the Tg is about 18 ppm/°C. while that above the Tg is only about 60 ppm/°C. This expansion property of the insulation support thus compares with the temperature dependent expansion of copper much better than do epoxy-based supports. It has also been found that the unsaturated polyester of the present invention is able to withstand thermal stress of 260° C., the temperature of molten solder, for over 50 times without substantial internal pad delamination. As a result of these superior physical properties of the polyester resin in the laminate of the present invention, use of this laminate in electronic circuit boards results in a substantial reduction in the number of failures of metal plated through holes during processing. It should be appreciated that the curing process disclosed herein also makes the insulation support of the present laminates less apt to deform to other stresses besides temperature, such as those stresses introduced by changing pressures.

Due to the high degree of inter-chain bonding and lack of a substantial amount of reactivity, the unsaturated polyester resins of the present invention are also less brittle than are other conventional resins. Consequently, laminates derived from the present unsaturated polyester resin do not crack as easily when handled nor do any cracks which do develop propagate as easily throughout the board.

In addition to the aforementioned superior physical properties, the metal-clad laminate of the instant invention also possesses electrical properties that are superior to those of FR4 epoxy. For example, the minimum volume resistivity of the insulation support of the invention is about $1 \times 10^8$ megohms-cm, while the minimum surface resistance is about $1 \times 10^8$ megohms. Additionally, the average maximum dissipation factor at 1 MHz is about 0.015, for the insulation material of the invention absent any glass structural reinforcement or fillers. The insulation support of the laminates of the present invention also has a dielectric constant of 3.2 to 3.8 at 1 MHz, compared to that of 4.2 to 5.0 at 1 MHz for FR4 epoxy. These superior electrical properties of the polyester resin further make the metal-clad laminates of the present invention superior to all previously available low cost metal-clad laminates.

In combination, the superior physical, electrical and mechanical properties of the metal-clad laminates of the present invention, highly reliable yet very thin electrical components can be manufactured, allowing for new designs in circuitry. For example, due to the superior properties such as dimensional stability and high resistivity of the insulation support in the laminate of the present invention, highly reliable electrical insulation materials, either single- or multi-layer, can be routinely produced with a thickness of about 4 mils per layer. This novel unsaturated polyester resin is also advantageous over previously available high performance materials due to the low cost of the components of the resin and the ability to manufacture the material through existing production processes widely known in the art of epoxy resin processing. Some representative physical and electrical properties of the resin used in laminates of the present invention are listed in Table 1, along with those of FR4 epoxy and polyimide (PI).

TABLE 1

Comparison of selected electrical insulation support materials with the MC4 material of the present invention.

|  | MC4 | FR4 | PI |
|---|---|---|---|
| Glass Transition Temperature (°C.) | 140–180 | 120–130 | 265 |
| Z-axis Expansion below Tg (ppm/°C.) | 18 | 55–80 | 49 |
| Z-axis expansion above Tg (ppm/°C.) | 60 | 250–400 | 195 |
| Z-axis Expansion (40° C. to 180° C.) (%) | 1.2–1.9 | 2.2–3.0 | 0.7 |
| Dielectric Constant at 1 MHz | 3.2–3.8 | 4.2–5.0 | 4.2–4.6 |
| Dissipation Factor at 1 MHz | 0.015 | 0.045 | 0.011 |
| Volume Resistivity (minimum) (Megohm-cm) | $10^8$ | $10^5$ | *** |
| Surface Resistivity (minimum) (Megohm) | $10^8$ | $10^3$ | *** |

(*** = data not available)

It would also be appreciated by those skilled in the art of metal-clad laminates that, due to its outstanding physical, electrical and mechanical properties, the product of the instant invention is useful for many applications. For example, the novel resin renders the metal-clad laminates of the present invention useful as E.M.I.-R.F.I. shielding material and as low impedance boards for the microwave industry. Additionally, electronic circuit boards comprising the product of the instant invention would be useful in the field of light weigh avionics. Overall, through use of electronic circuit boards derived from the process and product of the present invention, the reliability of inexpensive applications of electric circuit boards will be significantly enhanced, in particular, and the cost of boards required for the more demanding applications will decrease greatly without sacrificing reliability.

EXAMPLES

The resins used in these Examples are available from The Alpha Corp., Collierville, Tenn. under the names resin 67 and resin 78. Resin 67 is the partially unsaturated polyester resin preferred in the product and process of the invention and described herein, whereas resin 78 comprises the completely unsaturated polyester resin.

EXAMPLE 1

To a polyester resin blend consisting of 45%, by weight, resin 67 (System I) and 55%, by weight, resin 78 (System II), a brominated divinyl benzene derivative, Dibromostyrene, is added to a concentration of 39% monomer, by weight, corresponding to 23.4% by weight bromine, both as compared to the weight of the resin blend. Then, the adhesion promoter, methyl acrylic acid is added to the semi-unsaturated poluester resin blend at a concentration of 5%, by weight MAA, as compared to the weight of this resin blend, and the resulting blend is thoroughly mixed. To this semi-unsaturated resin blend is then added 0.2% t-butyl peroctoate (TBPO), 0.25% t-butyl peroxybenzoate (TBPB) (both available from Witco, Memphis, Tenn.) and 0.25% dicumylperoxide (DCP) free-radical generating catalysts, each by weight as compared to the weight of the semi-unsaturated resin. This mixture is then applied to a 0.0036 cm thick copper foil. The thickness of the resin layer is made to about 0.5 mm by doctor blade scraping. A reinforcement is then added by pressing an appropriate-sized woven mat of electrical grade glass fiber, weighing about 0.025 ounces per square foot, into the resin. The copper and resin are then placed on a laminating table and the temperature is raised to 115° C. to initiate the low tier of a three-tiered catalyst system. This temperature is maintained for about 3 minutes, as the copper and resin move across the laminating table. The curing laminate then enters a squeeze roller set to produce a cured laminate with a thickness of about 1 mm (4 mils) after which the copper and associated polyester resin are transported to an oven where the temperature of the laminate is raised to 145° C. to initiate the second and third tiers of the multi-tiered catalyst system and the exotherm of the reaction. The copper-clad laminate is then maintained at this higher temperature for about 8 minutes. The resultant board comprising the copper foil directly bonded to the unsaturated polyester resin, is then allowed to cool to room temperature. Properties of the laminate produced in accordance with this invention are:

| Tg, °C. | 140–180 |
|---|---|
| Copper Peel (Lb/in) | 3 to 4 |
| Dielectric Constant | 3.5 |
| Dissipation Factor at 1 MHz | 0.015 |
| Volume Resistivity (MΩ-cm) | $10^8$ |
| Surface Resistivity (MΩ) | $10^8$ |

EXAMPLE 2

A double-sided copper-clad laminate is prepared according to the process of Example 1, with the additional step wherein a second, 0.0036 cm thick, copper foil is applied to the curing copper-resin laminate. The second copper foil is brought into contact with the resin just prior to the movement of the laminate through the squeeze roller. The squeeze rollers are set to result in a fully cured product 0.25 mm in thickness. In the same fashion, by appropriately adjusting the size of the glass mat and doctor blade and squeeze roller settings, the double-sided copper-clad product of the invention is made in thicknesses made in final thicknesses of from 0.1 to 0.5 mm (4 to 20 mils).

EXAMPLE 3

A copper-clad laminate is prepared as in Example 1 with the exception that randomly distributing electrical grade glass fiber filaments are used for reinforcement instead of the electrical grade glass mat. The glass fibers, each about 2 inches long, are pressed into the polyester blend after the knife coating and prior to activation of the second tier catalyst. The glass fibers are added to the resin at a concentration of about 18% glass, by weight, as compared to the weight of the semi-unsaturated polyester resin blend.

EXAMPLE 4

A copper-clad laminate is prepared as in Example 1, with the exception that Georgia Kaolin is added to the semi-unsaturated resin blend at a concentration of about 10 parts Kaolin per 100 parts semi-unsaturated resin blend. The filler is added, with thorough mixing, after the vinyl monomer and prior to knife coating.

EXAMPLE 5

A cured MC4 unsaturated resin is prepared as in Example 4, with the exceptions that, in place of the Georgia Kaolin, CAT 10 filler is used, at a concentration of 12.5 parts, by weight, per 100 parts by weight of the semi-unsaturated polyester resin blend, and the copper is added as by the CC4 TM process. The CC4 filler is added, with thorough mixing, after the vinyl monomer and prior to knife coating.

EXAMPLE 6

A copper-clad laminate is produced as in Example 1, with the exception that Scotchlite TM (3M) glass microspheres are incorporated as a filler in the resin blend at 5% weight percent as compared to the weight of the semi-unsaturated polyester resin blend. The microspheres are added, with thorough mixing, after the addition of vinyl monomer and prior to knife coating.

It is understood that various other modifications will be apparent to an can readily be made by those skilled in the art without departing from the scope and spirit of this invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A metal foil laminate, comprising:
   a sheet of an unsaturated polyester resin blend having opposite first and second faces, a first sheet of metal foil.

2. The metal foil laminate as set forth in claim 1, said blend further comprising a flame-retardant material.

3. The metal foil laminate as set forth in claim 2, wherein said flame-retardant material is a halogenated vinyl monomer.

4. The metal foil laminate as set forth in claim 1, said multi-tier catalyst system consisting of three or four tiers.

5. The metal foil laminate as set forth in claim 4, said blend additionally comprising a flame-retardant material and a structural reinforcement means.

6. The metal foil laminate as set forth in claim 1, said blend additionally comprising a structural reinforcement means.

7. The metal foil laminate as set forth in claim 6, said structural reinforcement means comprising organic or inorganic, woven or non-woven, randomly oriented or non-randomly oriented material.

8. The metal foil laminate as set forth in claim 7, said blend additionally comprising: a flame-retardant material; a filler; and, an adhesion promoter.

9. The metal foil laminate as set forth in claim 1, said blend additionally comprising a filler.

10. The metal foil laminate as set forth in claim 1, said blend additionally comprising an adhesion promoter.

11. The metal foil laminate as set forth in claim 1, wherein said polyester resins are prepared from phthalic anhydride or maleic anhydride, and propylene glycol, ethylene glycol, or diethylene glycol.

12. The metal foil laminate as set forth in claim 1, wherein said first sheet of metal foil is copper;

13. The metal foil laminate as set forth in claim 1 additionally comprising a second sheet of metal foil bonded to said second face.

14. The metal foil laminate as set forth in claim 13 wherein said second sheet of metal foil is copper foil.

15. The metal foil laminate as set forth in claim 13, wherein both said first metal foil and said second metal foil are copper metal foil.

* * * * *

UNITED STATES PATENT AND TRADEMARK OFFICE
CERTIFICATE OF CORRECTION

PATENT NO. : 5,312,691
DATED : May 17, 1994
INVENTOR(S) : Thomas Edward EVEN et al.

It is certified that error appears in the above-indentified patent and that said Letters Patent is hereby corrected as shown below:

Column 17,
Please correct claim 1 to read.

1. A metal foil laminate, comprising:
    a sheet of an unsaturated polyester resin blend having opposite first and second faces, a first sheet of metal foil bonded to said first face, said unsaturated polyester resin blend comprising at least
    from about 20% to about 70% by weight a first polyester resin, said first resin being about 20% to about 70% ethylenically unsaturated,
    from about 30% to about 80% by weight a second polyester resin having a different degree of ethylenic unsaturation than said first polyester resin,
    a vinyl monomer, and
    an effective amount of a multi-tier, free radical catalyst system for curing said unsaturated polyester blend.

Signed and Sealed this

Thirtieth Day of August, 1994

Attest:

BRUCE LEHMAN

Attesting Officer     *Commissioner of Patents and Trademarks*